US012748064B2

(12) United States Patent
Tao et al.

(10) Patent No.: US 12,748,064 B2
(45) Date of Patent: Sep. 29, 2026

(54) METHOD FOR JUDGING AGING DEGREE OF INSULATION OF XLPE CABLE CONNECTOR BASED ON DYNAMIC HEAT SOURCE

(71) Applicants: Wuhan University, Wuhan (CN); China Huaneng Renewables Corporation Limited, Hubei, Wuhan (CN); China Huaneng Zhongxiang Wind Engery, Zhongxiang (CN)

(72) Inventors: Jinsong Tao, Wuhan (CN); Yingjie Chen, Wuhan (CN); Hao Bian, Wuhan (CN); Shujuan Zhang, Wuhan (CN); Qing Liu, Wuhan (CN); Yan Wang, Suizhou (CN); Jun Zhu, Wuhan (CN); Yang Xu, Wuhan (CN); Yang Lin, Wuhan (CN); Ge Peng, Wuhan (CN)

(73) Assignees: Wuhan University, Wuhan (CN); China Huaneng Renewables Corporation Limited, Hubei, Wuhan (CN); China Huaneng Zhongxiang Wind Engery, Zhongxiang (CN)

( * ) Notice: Subject to any disclaimer, the term of this patent is extended or adjusted under 35 U.S.C. 154(b) by 376 days.

(21) Appl. No.: 18/598,258

(22) Filed: Mar. 7, 2024

(65) Prior Publication Data

US 2024/0393271 A1 Nov. 28, 2024

(30) Foreign Application Priority Data

May 25, 2023 (CN) ......................... 202310619275.2

(51) Int. Cl.
*G01N 25/18* (2006.01)
*G06F 30/23* (2020.01)

(52) U.S. Cl.
CPC ............. *G01N 25/18* (2013.01); *G06F 30/23* (2020.01)

(58) Field of Classification Search
CPC ..... G01N 25/18; G06F 30/23; G06F 2113/06; G06F 2113/16; G06F 2119/04; G06F 2119/08
See application file for complete search history.

(56) References Cited

U.S. PATENT DOCUMENTS

2021/0172893 A1* 6/2021 Owens ................... G01N 27/18

FOREIGN PATENT DOCUMENTS

CN 111521552 A * 8/2020 ............. G01N 25/18
DE 102021213382 A1 * 11/2022 ............. G01N 17/00

OTHER PUBLICATIONS

Computer translation of DE_102021213382_A1 (Year: 2026).*
Computer translation of CN_111521552_A (Year: 2026).*

* cited by examiner

*Primary Examiner* — Randy W Gibson
(74) *Attorney, Agent, or Firm* — Hemisphere Law, PLLC

(57) ABSTRACT

A method for judging aging degree of insulation of a cable T-connector based on a dynamic heat source is provided. Specifically, a temperature rise verification test platform of the cable T-connector is constructed, and heating of a cable core is simulated by using a controllable heat source. Influence of different thermal conductivity of an insulation layer on internal and external temperature responses of the cable T-connector is studied, and the temperature rise test platform is constructed to simulate the temperature response of the outer skin of the cable T-connector under the same temperature change of the internal heat source and compare the temperature response of the outer skin of the cable T-connector in different states through experiments, so as to obtain (Continued)

the corresponding relationship between aging degree and heat transfer capacity.

5 Claims, 1 Drawing Sheet

METHOD FOR JUDGING AGING DEGREE OF INSULATION OF XLPE CABLE CONNECTOR BASED ON DYNAMIC HEAT SOURCE

TECHNICAL FIELD

The disclosure relates to the field of crosslinked polyethylene (XLPE) cable connectors, and more particularly to a method for judging aging degree of insulation of an XLPE cable connector based on a dynamic heat source.

BACKGROUND

In the power transmission system, high-voltage cable occupies an important position, plays a role as a link to transmit energy, and its reliable operation will directly affect the safety and stability of the whole power plant. According to relevant statistics, cable accessory failures account for more than 50% of cable failures. As a common cable accessory, a crosslinked polyethylene (XLPE) cable connector is mainly used to connect equipment and lines, generally at the end of cable lines, affected by the level of manufacturing and installation process, and its insulation performance is far worse than that of a cable body, which belongs to the weak link in a cable system. Common cable terminal connectors can be divided into T-connectors, elbow connectors, and straight connectors according to their shapes. The research object of this disclosure is the T-connector of the cable terminal, which is collectively referred to as cable T-connector for convenience of expression. Unless otherwise specified, the subsequent cable T-connector refers to the cable terminal T-connector. The typical failure of XLPE cable connectors is insulation breakdown. Taking two wind farms in a province of China as an example, since wind farm A was put into operation, there have been 11 times of main insulation breakdowns of T-connectors of box transformers since October 2019. Since the second phase of wind farm B was put into operation, there have been 8 times of main insulation breakdowns of T-connectors of box transformers since March 2019.

Due to the manufacturing process and long-term operation, there are defects in cables and XLPE cable connectors, which lead to local electric field distortion, partial discharge and uneven internal temperature distribution, and eventually lead to serious accidents such as insulation breakdown and even explosion. This is the cause of common faults of cables and XLPE cable connectors.

There are internal defects in cables and XLPE cable connectors due to construction process problems, which lead to internal electric field distortion and partial discharge. Under long-term operation, the internal temperature will change and insulation aging will eventually lead to insulation breakdown and explosion. In this process, temperature is an important dependent variable. By monitoring the temperature changes of cables and XLPE cable connectors, the operational safety of cables and XLPE cable connectors can be effectively improved.

Given this, a method for judging aging of insulation of cable connectors is required.

SUMMARY

The disclosure aims to provide a method for judging aging degree of insulation of a cable T-connector based on a dynamic heat source, and a corresponding relationship between the aging degree and heat transfer capacity is obtained by comparing temperature response of cable T-connectors in different states.

Technical solutions of the disclosure are as follows.

Specifically, a method for judging aging degree of insulation of a cable T-connector based on a dynamic heat source includes the following steps:

S1, constructing a temperature rise verification test platform of the cable T-connector, and simulating heating of a cable core by using a controllable heat source; and S2, using the constructed temperature rise verification test platform to study influence of different thermal conductivity of an insulation layer on internal and external temperature responses of the cable T-connector, comparing temperature responses of inner and outer skins of the cable T-connector in different states by experiments under a same internal heat source temperature change, and fitting temperature response curves of the inner and outer skins to obtain a phase angle difference, so as to judge a corresponding relationship between aging degree and heat transfer capacity according to the phase angle difference of the cable T-connector with different aging degrees.

In an embodiment, a controllable heat source is placed inside the cable T-connector.

In an embodiment, an infrared sensor is placed outside the cable T-connector to measure temperature of the inner and outer skins of the cable T-connector.

In an embodiment, a heat transfer mode in the cable T-connector is heat conduction.

In an embodiment, a differential equation of the heat conduction is expressed as:

$$\rho_1 c\frac{\partial T}{\partial t} = \frac{\partial}{\partial x}\left(\lambda\frac{\partial T}{\partial x}\right) + \frac{\partial}{\partial y}\left(\lambda\frac{\partial T}{\partial y}\right) + \frac{\partial}{\partial z}\left(\lambda\frac{\partial T}{\partial z}\right) + Q_1;$$

where $Q_1$ represents heat production rate of a medium; $\lambda$ represents thermal conductivity; T represents temperature; t represents time; c represents specific heat capacity; and $\rho_1$ represents density of the medium.

The disclosure has technical effects as follows.

In the disclosure, a three-dimensional model of the crosslinked polyethylene (XLPE) cable connector (i.e., the above-mentioned cable T-connector) is constructed, and multiple defect models are added for simulation. Compared with the two-dimensional model, the disclosure can simulate and analyze the operation situation of the real cable connector with defects. According to the disclosure, the temperature field distribution characteristics of the XLPE cable connector under different aging degrees are analyzed to obtain the temperature field distribution of the XLPE cable connector under the influence of different aging degrees, so that the temperature field variation characteristics of the XLPE cable connector with different aging degrees can be obtained, and a theoretical basis is laid for judging the aging degree of the XLPE cable connector.

BRIEF DESCRIPTION OF DRAWINGS

The accompanying drawings generally illustrate various embodiments by way of example and not limitation, and together with the description and claims, serve to illustrate the invented embodiments. Where appropriate, the same reference numerals are used throughout the drawings to refer to the same or similar parts. Such embodiments are illustrative and are not intended to be exhaustive or exclusive embodiments of the present apparatus or method.

DETAILED DESCRIPTION OF EMBODIMENTS

It should be noted that embodiments in the disclosure and features in the embodiments can be combined with each other without conflict. The disclosure will be described in detail with reference to the accompanying drawings and embodiments.

Specifically, a method for judging aging degree of insulation of a cable T-connector based on a dynamic heat source includes the following steps.

Firstly, a temperature rise verification test platform of the cable T-connector is constructed, and heating of a cable core is simulated by using a controllable heat source. The validity of a finite element simulation model is verified by experiments.

A temperature monitoring position of the cable T-connector is determined, and the influence of ambient temperature on the corresponding outer skin temperature under the maximum allowable operating temperature of core is studied, so as to provide theoretical support for the online temperature monitoring of the cable T-connector in wind farm. The simulation model is used to study the influence of different thermal conductivity of an insulation layer on internal and external temperature responses of the cable T-connector, and the temperature rise test platform is constructed to simulate the temperature response of the outer skin of the cable T-connector under the same temperature change of the internal heat source and compare the temperature response of the outer skin of the cable T-connector in different states through experiments, so as to obtain the corresponding relationship between aging degree and heat transfer capacity.

Figure 1:
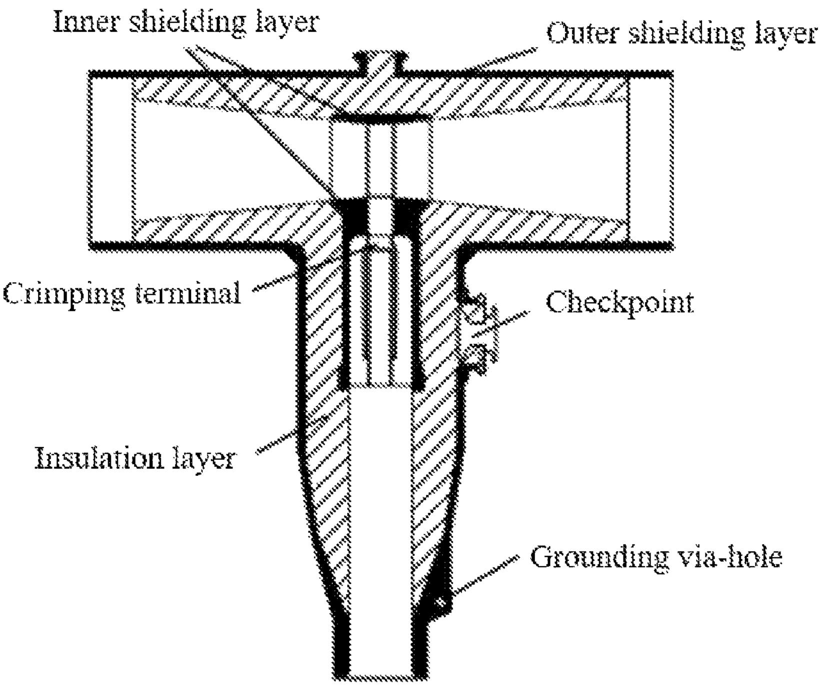
FIG. 1 illustrates a schematic diagram of a T-connector of a 35 kilovoltages (kV) cable of the disclosure.
Figure 2:
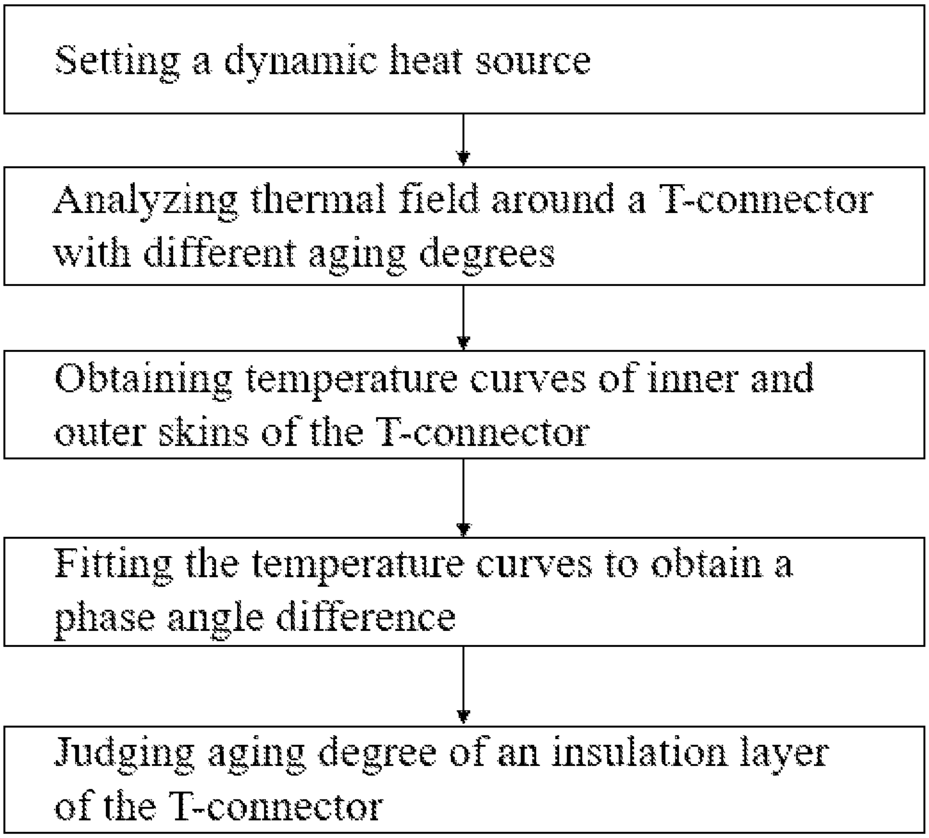
FIG. 2 illustrates a flowchart of a technical scheme of the disclosure.

A flowchart of technical scheme adopted by the disclosure is shown in FIG. 2, which includes the following steps.

(1) A temperature rise verification test platform of a cable T-connector is constructed, and heating of a cable core is simulated by using a controllable heat source. The influence of ambient temperature on the corresponding outer skin temperature under the maximum allowable operating temperature of core is studied, so as to provide theoretical support for the online temperature monitoring of the cable T-connector in wind farm.

(2) The corresponding relationship between aging degree and heat transfer capacity is judged. Using the constructed test platform, the influence of different thermal conductivity of the insulation layer on the internal and external temperature responses of the cable T-connector is studied. Under the same temperature change of the internal heat source, the temperature responses of inner and outer skins of the cable T-connector in different states are compared by experiments, and temperature response curves of the inner and outer skins are fitted to obtain a phase angle difference, so that the corresponding relationship between aging degree and heat transfer capacity can be judged according to the phase angle difference of the T-connector with different aging degrees. It should be noted that the above-mentioned cable T-connector is a crosslinked polyethylene (XLPE) cable T-connector. Part of the phenomenon reflected in the aging process of insulation of the XLPE T-connector is the separation of large molecules of hydrocarbons into small molecules, and the heat transfer between molecules is slower than that within molecules. Therefore, when the inner surface of the insulation changes and the heat source heats up, the aging degree of the insulation of the XLPE T-connector can be analyzed based on the thermal response time of the outer surface and the rate of temperature change inside and outside. The temperature response time of better insulation is faster than that of insulation with more severe aging degree. In this situation, the aging degree of the insulation of XLPE T-connector can be determined to prevent cable failure.

1. Thermal Field Simulation Analysis of Cable T-Connector Theoretical Analysis of Temperature Field of Cable T-Connector (1) Analysis of Basic Principles of Heat Transfer There are three ways of heat transfer: heat conduction, heat convection, and heat radiation. Any actual heat transfer process is carried out in combination with these three ways, which can be one of them, but in most cases, it is carried out in two or three ways at the same time.

(2) Governing Equation and Internal Heat Source Analysis

In the cable T-connector, the heat transfer mode belongs to heat conduction. In order to simplify the analysis, the following assumptions are made before establishing the equation: first, the object of study belongs to an isotropic continuous medium; second, there is a heat source inside the study object. Therefore, in a rectangular coordinate system, a differential equation of the heat conduction is expressed as:

$$\rho_1 c\frac{\partial T}{\partial t}=\frac{\partial}{\partial x}\left(\lambda\frac{\partial T}{\partial x}\right)+\frac{\partial}{\partial y}\left(\lambda\frac{\partial T}{\partial y}\right)+\frac{\partial}{\partial z}\left(\lambda\frac{\partial T}{\partial z}\right)+Q_1. \tag{5}$$

In the equation (5), $Q_1$ represents heat production rate of the medium; $\lambda$ represents thermal conductivity; T represents temperature; t represents time; c stands for specific heat capacity; and $\rho_1$ represents density of the medium.

(3) Analysis of Boundary Conditions

The boundary conditions of temperature field are used to indicate the heat conduction on the boundary of medium and the relationship with the surrounding environment. According to basic theory of heat transfer, there are usually the following three types.

a. The first kind of boundary condition is temperature distribution on the boundary of the known medium and its law of change with time, and the equation is expressed as:

$$T|_S=T_1(x,y,z,t). \tag{6}$$

In the equation (6), S represents a medium interface and $T_1$ represents a temperature function of the boundary of the medium. When the temperature on the boundary remains constant during the whole process of heat conduction, $T_1$ is a fixed value.

b. The second kind of boundary condition is the known heat flux distribution (also referred to as heat flux density distribution) on the boundary of medium and its law of change with time, which is called heat conduction boundary condition. According to Fourier's law, the equation is expressed as:

$$-\lambda \frac{\partial T}{\partial n}\bigg|_s = q(x, y, z, t). \tag{7}$$

In the equation (7), λ represents thermal conductivity; T represents temperature; n represents a normal direction of the interface; q represents heat flux (also referred to as heat flux density); and t represents time.

c. The third kind of boundary condition is that given the heat transfer coefficient between the medium surface on the medium boundary and the surrounding environment and the temperature of the surrounding environment, according to the heat balance law of the medium boundary surface, the heat flux from the medium interior to the boundary surface should be equal to the heat flux from the boundary surface to the surrounding environment. Therefore, according to Fourier's law and Newton cooling formula, the equation is expressed as:

$$-\lambda \frac{\partial T}{\partial n}\bigg|_S = h(T - T_0). \tag{8}$$

In the equation (8), h represents a commutation coefficient of the medium surface and $T_0$ represents temperature of the surrounding environment.

2. Temperature Response Principle and Simulation Analysis

With the increase of service life, the insulation layer of cable T-connector will age in different degrees. The aging of insulating materials includes many forms, such as thermal aging, electrical aging, or combined thermal and electrical aging. In this disclosure, the influence of insulation aging on the thermal diffusivity of the insulation layer of the cable T-connector is investigated by studying the response of internal and external temperatures of the cable T-connector in different states.

Thermal diffusivity is a physical quantity that characterizes the speed of temperature conduction from one point to another point in an object. The higher the thermal diffusivity of an object, the faster the thermal energy diffuses in the object. The lower the thermal diffusivity, the slower the thermal energy diffuses in the object. Thermal diffusivity is related to the thermal conductivity and heat capacity per unit volume of an object, and equation is expressed as:

$$\alpha = \frac{\lambda}{\rho \cdot c}. \tag{9}$$

In the equation (9), a represents thermal diffusivity, λ represents thermal conductivity of the object, ρ represents density of the object, and c represents specific heat capacity of the object. From the expression of thermal diffusivity, it can be seen that it is a comprehensive physical parameter, which is generally used to describe the unsteady heat conduction process, but does not play a role in the steady heat conduction process. When the density and specific heat capacity of an object are constant, the greater the thermal conductivity, the higher the thermal diffusivity of the object, and the relationship between them is proportional.

In solid materials, heat is transferred through the vibration of the lattice structure formed inside the material. The more regular the lattice structure is and the closer the connection between them is, the easier the heat is transferred inside the material. In addition to the lattice structure, metal materials also contain a large number of free electrons, which can pass through the lattice and collide with each other, making heat transfer faster. Therefore, the thermal conductivity of metal materials is generally better than other materials.

3. Cable T-Connector Temperature Rise Experiment

The established temperature rise model of cable T-connector can be used to analyze the thermo-electric field. Based on the theory of equivalent heat source, the controllable heat source controlled by alternating current is used to simulate the cable core under actual operation, which is put into the actual cable T-connector to construct a temperature rise test platform to verify the effectiveness of the model.

A variety of different heating curves are set on the controllable heat source, and the corresponding temperature response curves of the outer skin at ambient temperature are measured, and the inner and outer skin temperature curves are fitted respectively.

The temperature response curves of the outer skin obtained from the experiment all show a trend of gradually increasing from the ambient temperature, and the increasing speed is larger in the middle, and then gradually becomes flat.

The above is only the illustrated embodiment of the disclosure, but the protection scope of the disclosure is not limited thereto. Any equivalent substitution or change made by any skilled in the art within the technical scope disclosed by the disclosure according to the technical solution of the disclosure and the inventive concept thereof shall be covered within the scope of protection of the disclosure.

What is claimed is:

1. A method for judging aging degree of insulation of a cable T-connector based on a dynamic heat source, comprising the following steps:

S1, constructing a temperature rise verification test platform of the cable T-connector, and simulating heating of a cable core by using a controllable heat source; and S2, using the constructed temperature rise verification test platform to study influence of different thermal conductivity of an insulation layer on internal and external temperature responses of the cable T-connector, comparing temperature responses of inner and outer skins of the cable T-connector in different states by experiments under a same internal heat source temperature change, and fitting temperature response curves of the inner and outer skins to obtain a phase angle difference, so as to judge a corresponding relationship between aging degree and heat transfer capacity according to the phase angle difference of the cable T-connector with different aging degrees; and wherein the method further comprises:

based on the judged aging degree of the insulation of the cable T-connector, generating an alert signal indicative of the aging degree and outputting the alert signal indicative of the aging degree; and based on the alert signal indicative, automatically adjusting an operating parameter of a power system associated with the cable T-connector to prevent cable failure.

2. The method according to claim 1, wherein the controllable heat source is placed inside the cable T-connector.

3. The method according to claim 1, wherein an infrared sensor is placed outside the cable T-connector to measure temperature of the inner and outer skins of the cable T-connector.

4. The method according to claim 1, wherein a heat transfer mode in the cable T-connector is heat conduction.

5. The method according to claim 4, wherein a differential equation of the heat conduction is expressed as:

$$\rho_1 c \frac{\partial T}{\partial t} = \frac{\partial}{\partial x}\left(\lambda \frac{\partial T}{\partial x}\right) + \frac{\partial}{\partial y}\left(\lambda \frac{\partial T}{\partial y}\right) + \frac{\partial}{\partial z}\left(\lambda \frac{\partial T}{\partial z}\right) + Q_1;$$

where $Q_1$ represents heat production rate of a medium; $\lambda$ represents thermal conductivity; T represents temperature; t represents time; c represents specific heat capacity; and $\rho_1$ represents density of the medium.

* * * * *